(12) United States Patent
Yen et al.

(10) Patent No.: US 9,410,236 B2
(45) Date of Patent: Aug. 9, 2016

(54) SPUTTERING APPARATUS AND METHOD

(71) Applicant: TSMC Solar Ltd., Taichung (TW)

(72) Inventors: Wen-Tsai Yen, Caotun Township (TW); Chung-Hsien Wu, Luzhu Township (TW); Shih-Wei Chen, Kaohsiung (TW); Ying-Hsin Wu, Taichung (TW); Jui-Fu Hsueh, Tainan (TW); Kuan-Chu Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 570 days.

(21) Appl. No.: 13/689,172

(22) Filed: Nov. 29, 2012

(65) Prior Publication Data

US 2014/0144769 A1 May 29, 2014

(51) Int. Cl.
*C23C 14/34* (2006.01)
*C23C 14/08* (2006.01)
*H01J 37/32* (2006.01)
*C23C 14/56* (2006.01)

(52) U.S. Cl.
CPC ........... *C23C 14/086* (2013.01); *C23C 14/3407* (2013.01); *C23C 14/3492* (2013.01); *C23C 14/56* (2013.01); *H01J 37/32651* (2013.01)

(58) Field of Classification Search
CPC ................ H01J 37/32651; C23C 14/3492
See application file for complete search history.

(56) References Cited

U.S. PATENT DOCUMENTS

| | | | | |
|---|---|---|---|---|
| 3,736,425 A | * | 5/1973 | Chernow | H01J 37/3171 250/491.1 |
| 5,215,639 A | | 6/1993 | Boys | |
| 6,027,631 A | * | 2/2000 | Broadbent | 205/137 |
| 6,045,671 A | * | 4/2000 | Wu et al. | 506/40 |
| 2005/0034979 A1 | * | 2/2005 | Druz et al. | 204/298.02 |

* cited by examiner

*Primary Examiner* — Jason M Berman
(74) *Attorney, Agent, or Firm* — Duane Morris LLP; Steven E. Koffs

(57) ABSTRACT

A sputtering apparatus comprises a chamber configured to contain at least one sputter target and at least one substrate to be coated. The chamber has at least one adjustable shielding member defining an adjustable aperture. The member is positioned between the at least one sputter target and the at least one substrate. The aperture is adjustable in at least one of the group consisting of area and shape.

20 Claims, 7 Drawing Sheets

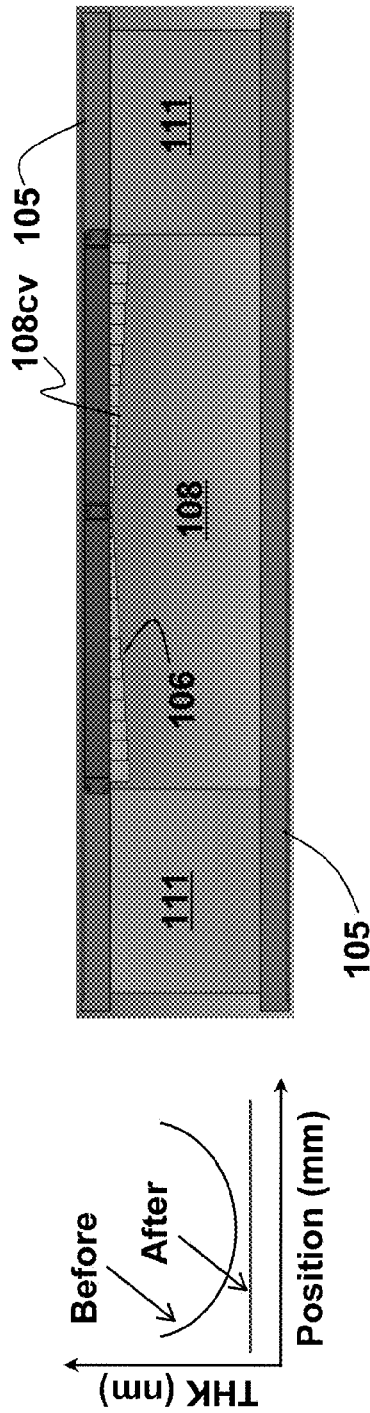
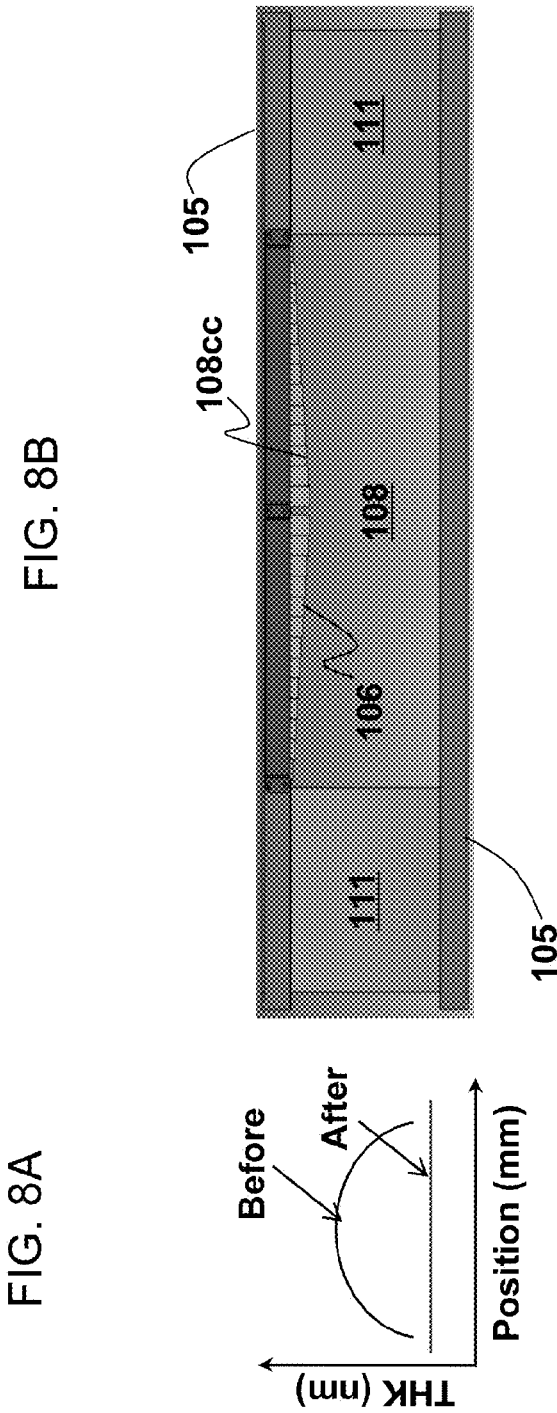

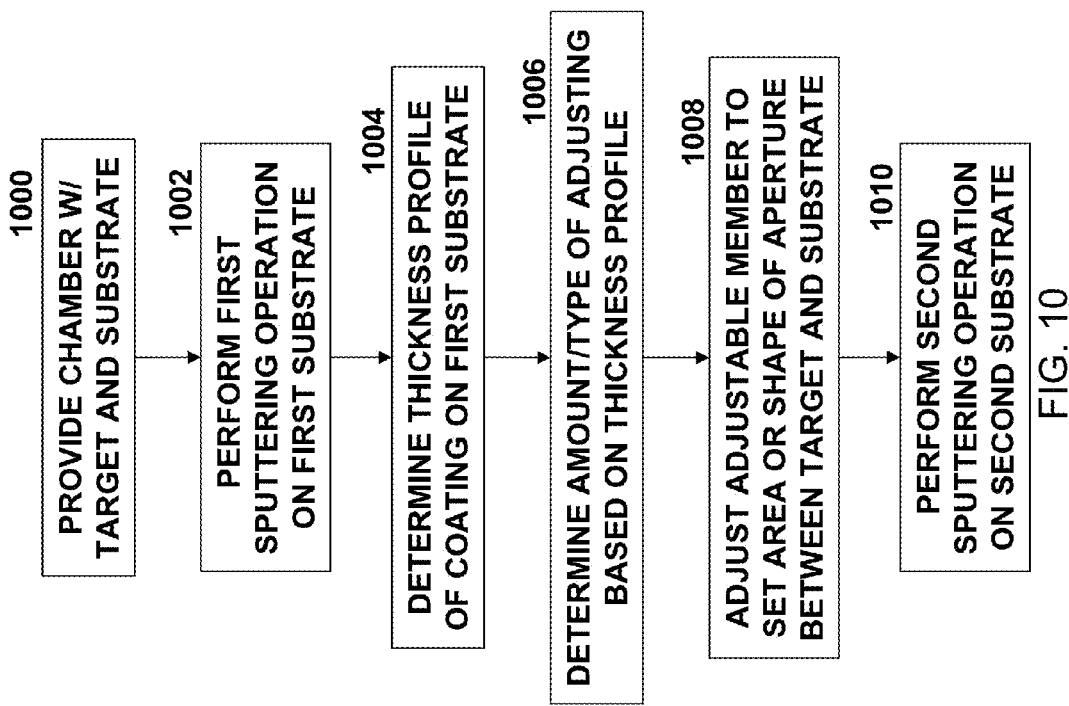

SPUTTERING APPARATUS AND METHOD

FIELD

This disclosure relates to sputtering apparatus and methods for depositing thin films.

BACKGROUND

Sputtering is a physical vapor deposition (PVD) method of depositing thin films by ejecting, material from a "target," that is source. This material is then deposited onto a "substrate," such as a semiconductor wafer.

Sputtering sources use strong electric and magnetic fields to trap electrons close to the surface of the target. The electrons follow helical paths around the magnetic field lines and collide with the target surface, transferring kinetic energy to particles that are ejected from the target towards the substrate. Sputtering can be performed at a lower temperature than a melting temperature of the target material.

Sputtering has been considered for use in fabricating thin film photovoltaic solar cells. Because the solar panels occupy a large substrate area, maintaining thickness uniformity throughout the length and width of a thin film solar panel is a challenge.

BRIEF DESCRIPTION OF THE DRAWINGS

FIG. 8A is a graph showing a coating thickness profile produced by the sputtering apparatus before and after adjusting the adjustable shielding member as shown in FIG. 8B.

FIG. 9A is a graph showing a coating thickness profile produced by the sputtering apparatus before and after adjusting the adjustable shielding member as shown in FIG. 9B.

FIG. 10 is a flow chart of a method for adjusting the sputtering apparatus.

DETAILED DESCRIPTION

Figure 1:
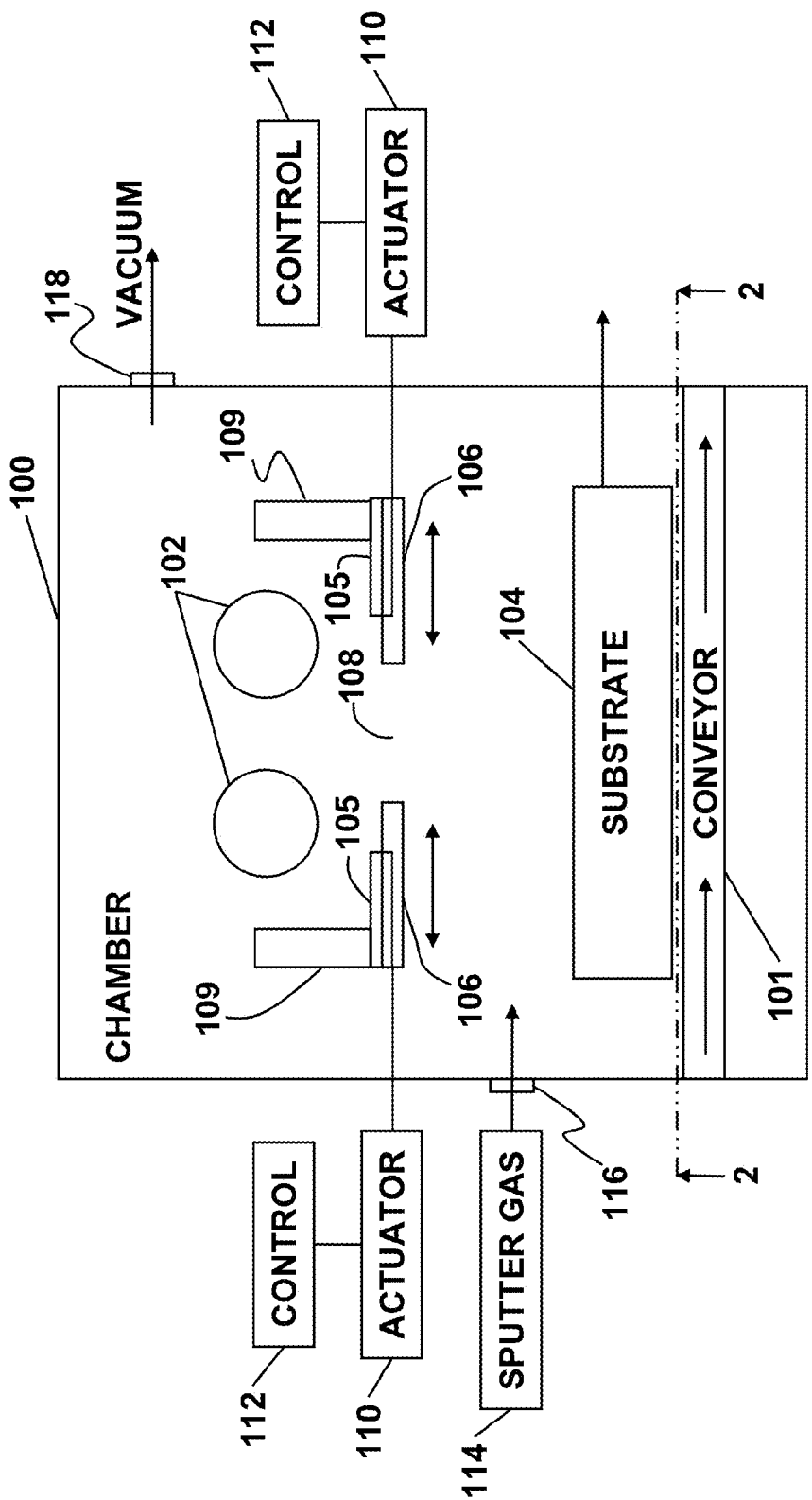
FIG. 1 is a schematic front view of a sputtering apparatus.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Methods and apparatus are described herein to improve thin film thickness uniformity by using at least one adjust shielding member or plate. The profile of the aperture area of the shielding plate can be adjusted by automated controls, or manually.

Figure 2:
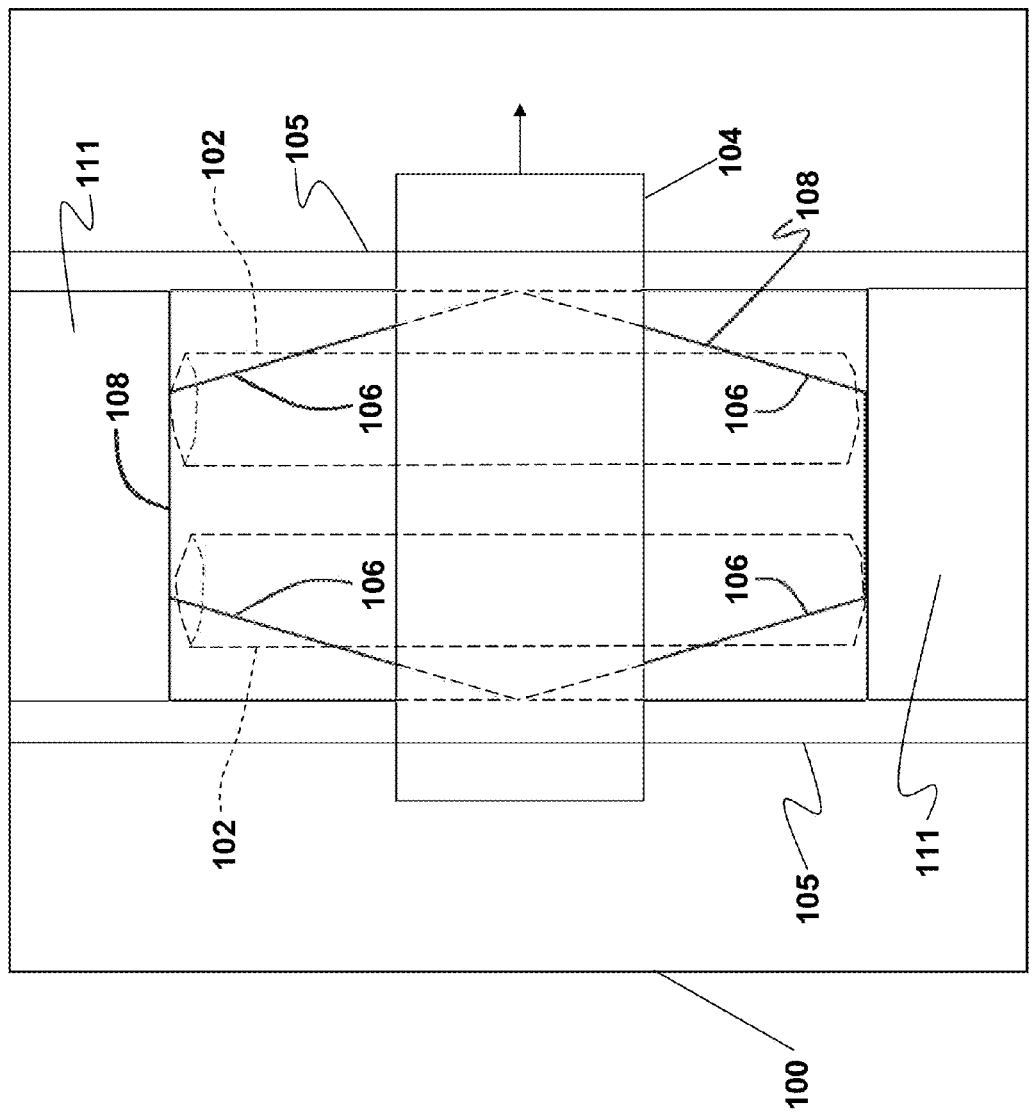
FIG. 2 is a schematic bottom plan view of the apparatus of FIG. 1, as seen from section line 2-2 of FIG. 1.
Figure 4:
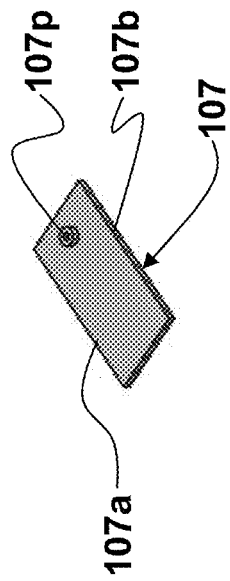
FIG. 4 is an isometric view of one of the slats of the adjustable shielding member shown in FIG. 3.

FIG. 1 is a schematic elevation view of a sputtering apparatus. FIG. 2 is a bottom plan view of the apparatus of FIG. 1. The apparatus 100 includes a chamber 100 configured to contain at least one sputter target 102 and at least one substrate 104 to be coated with the material from which the target is formed. Although a cylindrical target 102 is shown, targets having other configurations (e.g., flat) can also be used. The chamber 100, in which the deposition takes place, is maintained under vacuum by a suitable vacuum pump (not shown). A vacuum port 118 is provided for evacuating air from the chamber 100, and a sputter gas port 116 is provided for feeding an inert gas (e.g., argon, neon or the like) into the chamber 100. The apparatus 100 is suitable for processing substrates 104 which are larger in surface area than the cross section of the aperture 108 through which the material to be deposited passes. Thus, in the case of a large substrate, such as a solar panel, material is not deposited over the entire surface area of the substrate 104 simultaneously. Substrates 104 are carried through the chamber 100 on an endless conveyor 101. Material is deposited on each region of the substrate 104 as that region passes the aperture 108.

In some embodiments, the substrate 104 is a thin film solar cell or a panel having a plurality of thin film solar cells. Such solar cells or panels 104 include a photovoltaic thin film which serves as light absorber material, formed over a substrate. Suitable materials for the underlying substrate include for example without limitation, glass (such as soda lime glass), ceramic, metals such as thin sheets of stainless steel and aluminum, or polymers such as polyamides, polyethylene terephthalates, polyethylene naphthalates, polymeric hydrocarbons, cellulosic polymers, polycarbonates, polyethers, combinations thereof, or the like. The photovoltaic film is formed over substrate.

In some embodiments, the photovoltaic material is copper indium gallium (di)selenide (CIGS), a I-III-VI$_2$ semiconductor material composed of copper, indium, gallium, and selenium. CIGS is a solid solution of copper indium selenide (often abbreviated "CIS") and copper gallium selenide. CIGS is a tetrahedrally bonded semiconductor, with the chalcopyrite crystal structure, and a bandgap varying continuously with x from about 1.0 eV (for copper indium selenide) to about 1.7 eV (for copper gallium selenide).

In an embodiment, the photovoltaic may comprise a p-type material. For example, the absorber layer can be a p-type chalcogenide material. In a further embodiment, the absorber layer can be a CIGS Cu(In,Ga)Se$_2$ material. In other embodiments, chalcogenide materials including, but not limited to, Cu(In,Ga)(Se, S)$_2$ or "CIGSS," CuInSe$_2$, CuGaSe$_2$, CuInS$_2$, and Cu(In,Ga)S$_2$. can be used as an absorber layer material. Suitable p-type dopants that can be used for forming absorber layer include without limitation boron (B) or other elements of group II or III of the periodic table. In another embodiment, the absorber layer may comprise an n-type material including, without limitation, cadmium sulfide (CdS).

In other embodiments, the photovoltaic material is amorphous silicon (a-Si), protocrystalline, nanocrystalline (nc-Si or nc-Si:H), black silicon. or other thin-film silicon (TF-Si), Cadmium telluride (CdTe), or Dye-sensitized solar cell (DSC) or other organic solar cell material.

In some embodiments, the adjustable shielding method and apparatus described herein are used for depositing one or more other layers, besides the photovoltaic material. For example, in some embodiments, an initial molybdenum (Mo) bilayer is first sputtered onto a glass substrate as the first electrode layer. A P1 microchannel is scribed in the Mo layer. Then the photovoltaic (absorber) layer described above is sputtered over the Mo layer. A selenium layer is deposited, and a rapid thermal annealing process (RTP) is performed. Then a buffer layer of CdS, AnS or InS is formed by sputtering, atomic layer deposition (ALD) or chemical-bath-deposition (CBD). The P2 microchannel is scribed. Then, the second electrode layer (e.g., a zinc oxide (i-ZnO) or Aluminum doped ZNO (AZO), boron-doped ZnO (BZO) is sputtered (or formed by Metal Organic Chemical Vapor Deposition, MOCVD) over the buffer layer. In various embodiments, the shielding method and apparatus described herein can be used for sputtering any one or more of the Mo layer, absorber layer, the buffer layer, and/or the second electrode layer.

The sputtering apparatus is also suitable for sputtering material onto other types and sizes of substrates, including but not limited to semiconductor wafers.

Referring again to FIGS. 1 and 2, the chamber 100 has at least one adjustable shielding member 106 (e.g., at least one shielding plate) defining an adjustable aperture 108. The at least one member 106 is positioned between the at least one sputter target 102 and the at least one substrate 104. The aperture 108 is adjustable in at least one of the group consisting of area and shape. Some embodiments (e.g., FIGS. 3-9B) include one adjustable shielding member 106 along one of the longer side edges of aperture 108. Other embodiments (e.g., FIGS. 1-2) include respective adjustable shielding members 106 on each of the two long sides of the aperture 108. Other embodiments (not shown) include respective adjustable shielding members 106 on one or both of the two short ends of the aperture 108, adjacent the plates 111.

As best seen in FIGS. 3-6, in some embodiments, the at least one adjustable shielding member 106 includes a plurality of independently movable slats 107, arranged parallel to each other along at least one side of the aperture 108. The slats 107 can be formed of a shielding material such as metal (e.g., stainless steel or aluminum), which blocks penetration of the energized sputtered particle from the target. The plurality of slats 107 on at least one side are spaced sufficiently close to each other so that an edge defining the aperture is substantially continuous along ends of the plurality of slats, and the aperture is substantially continuous along the two opposite sides.

Thus, if there is a small gap (relative to the width of the slats) between each pair of adjacent slats 107, the size of aperture 108 is still effectively reduced, as the passage of target material particles through any spaces between adjacent slats 107 is small.

Figure 3:
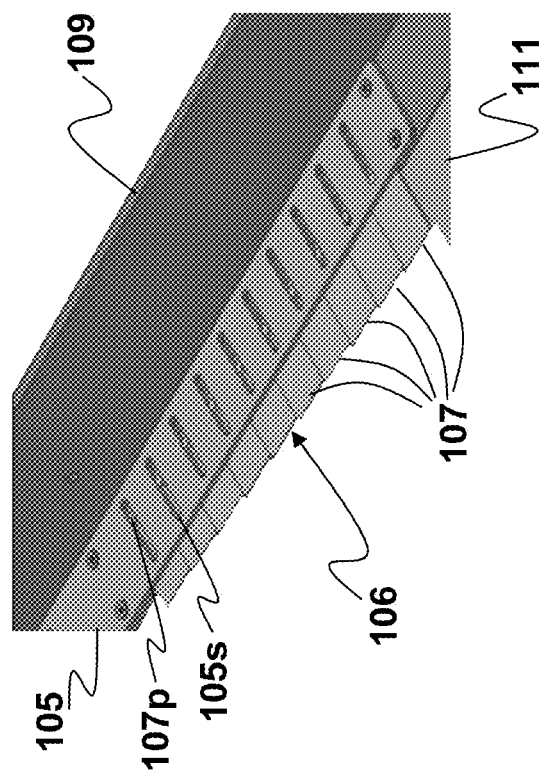
FIG. 3 is an isometric view of an adjustable shielding member as shown in FIG. 2.

In FIG. 3, two opposite sides of the aperture 108 have a frame member 109. In some embodiments, the frame member is in the form of steel or aluminum angle stock. Each of the plurality of slats 107 has a guide mechanism 107p for guiding movement of that slat. In the example of FIG. 7, the guide mechanism is 107p is a projection. Each slat 107 has a projection 107p on itsface, The projections 107p can have a variety of shapes, such as circular, elliptical, or rectangular. A plate 105 is mounted to the frame member 109 and has a plurality of slots 105s adapted to receive the projections 107p of respective plates. A shield plate 113 (FIG. 7) protects the plate 105, and prevents contamination by material sputtered from the targets 102. In other embodiments (not shown), the plate 105 has a plurality of projections, and each slat 107 has a respective slot configured to receive a respective one of the projections.

In the example of FIG. 3, the slats are sized and spaced so that each slat slidably abuts the adjacent slats on either side. In some embodiments, the abutting side edges 107a, 107b are flat. In other embodiments, one side edge 107a of each slat 107 has a longitudinal groove, and the other side edge 107b has a longitudinal ridge or tongue sized and shaped to be received by the groove of an adjacent slat 107.

Figure 6:
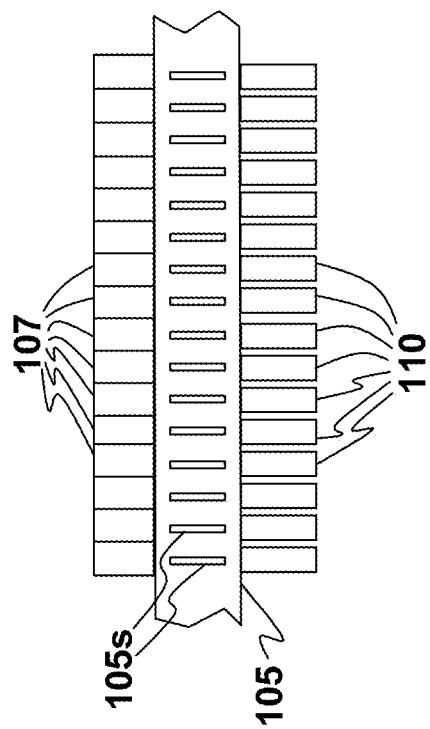
FIG. 6 shows a plurality of linear actuators or servomotors for positioning the slats of FIG. 3.
Figure 5:
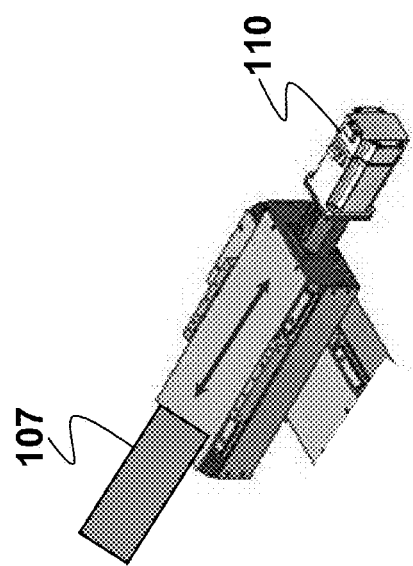
FIG. 5 shows a linear actuator or servomotor for positioning the slat of FIG. 4.

As best seen in FIGS. 5 and 6, the apparatus includes a respective linear actuator or servomotor 110 for each respective movable slat 107. The chamber 100 is configured to be operated at a partial vacuum pressure below atmospheric pressure; and the linear actuators or servomotors 110 are configured to be adjusted remotely while the chamber is at the partial vacuum pressure. Thus, adjustment and reconfiguration of the aperture 108 can be accomplished without opening the chamber 100 or breaking the vacuum.

The linear actuators or servomotors 110 can be controlled by a wired or wireless interface. In some embodiments, each actuator is coupled to a control unit 112. In some embodiments, the control unit 112 is a programmed general purpose processor. In other embodiments, the control unit is an embedded microcontroller or microprocessor, or a programmable logic controller (PLC). In some embodiments, the control unit 112 sets the extension length of each actuator or servomotor 110 according to one of a predetermined set of profiles. For example, these profiles can include a convex aperture 108 (wider in the center than at the ends) as shown in FIG. 8B, or a concave aperture 108 (wider at the ends than at the middle) as shown in FIG. 9B).

As shown in FIG. 6, if the movable slats 107 are all fully retracted, the distal ends of the slats 107 form a straight line parallel to the plate 105, so that the aperture 108 defined by the adjustable shielding member 106 is substantially rectangular. The size of the aperture 108 can be adjusted (without changing aperture shape) by extending or retracting all of the slats 107 by an equal distance.

FIG. 3 shows the slats 107 arranged so that the extension of each respective slat 107 varies linearly from one end of the at least one adjustable shielding member 106 to the other end. Although there are small step increments of extension between adjacent slats 107, this arrangement approximates a straight diagonal line. The larger the number of slats in each side (and the smaller the width of each slat), the closer the edge of the aperture approaches a straight line or smooth curve shape. With straight edges on three sides of the aperture 108, and the arrangement of FIG. 3 substantially diagonal to the other three edges, the aperture 108 can be adjusted to have a substantially right trapezoidal shape.

FIG. 2 shows a configuration with adjustable shielding members 106 along each long side of aperture 108. The adjustable shielding members 106 can be configured so that the aperture 108 is wider at the center and narrower at the ends. In this configuration, the aperture 108 has a substantially hexagonal shape. If the thickness distribution is symmetrical before adjusting the aperture 108, it is useful to apply the same adjustment to the shielding members 106 on both opposite sides of the aperture 108.

Figure 7B:
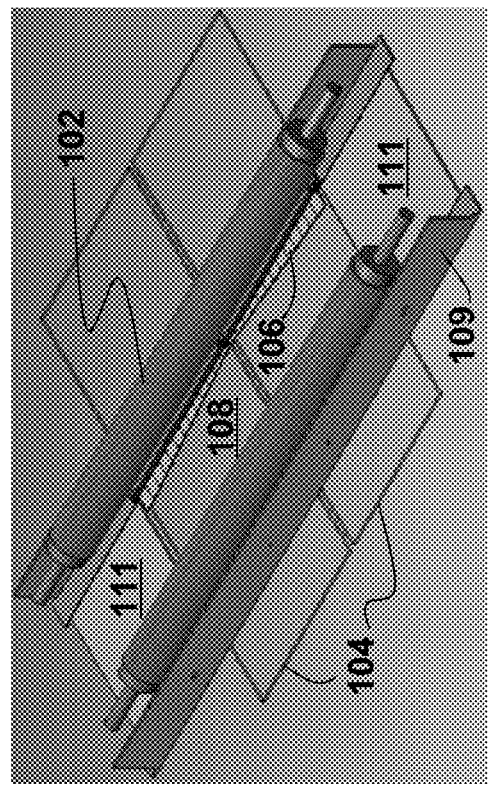
FIG. 7B is an isometric view of the aperture and adjustable shielding member of FIG. 1.

FIGS. 7B and 8B show a configuration with an adjustable shielding member 106 along one long side of aperture 108. The adjustable shielding member 106 can be configured so that one of the longer sides of the aperture 108 is wider at the center and narrower at the ends. In this configuration, the aperture 108 has a substantially pentagonal shape. If uneven wear produces substantial differences between the two targets, and the thickness of the coating before adjusting the shielding member 106 is asymmetric, then it may be advantageous to apply different adjustments on the shielding members 106 on opposite sides of the aperture, to reduce the asymmetry in the thickness. Thus, as shown in FIG. 7B, adjustment of the edge on one side of the aperture 108 can reduce the asymmetry in the thickness.

Figure 7A:
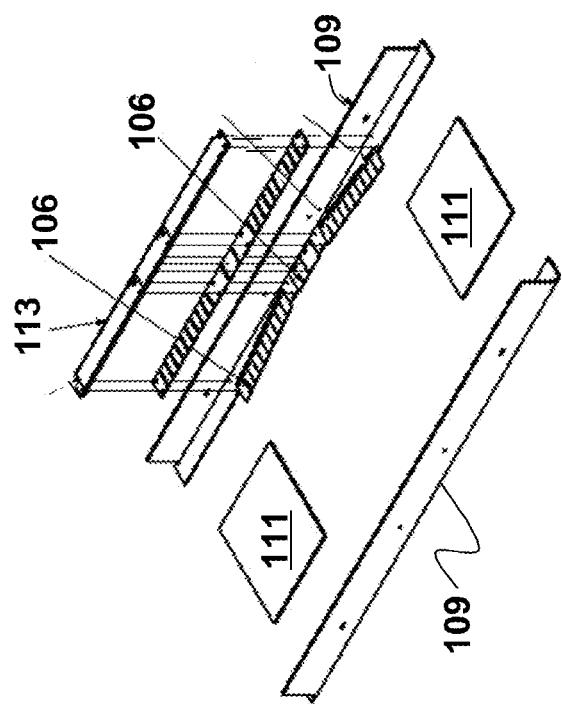
FIG. 7A is an exploded view of the aperture and adjustable shielding member of FIG. 1.

FIG. 7A shows a configuration in which adjustable shielding member 106 is configured so that one of the longer sides of the aperture 108 is flat at the center and tapers off towards both ends. In this configuration, the aperture 108 has a substantially hexagonal shape.

Further, if adjustable shielding members 106 are included along both longer sides of the aperture 108, and arranged in this configuration, an octagonal aperture can be formed.

FIG. 9B shows the adjustable shielding member 106 adjusted so that the aperture 108cc is narrower at the center than at the ends. In a configuration having adjustable shielding members 106 on both of the long sides of the aperture 108, the aperture 108cc has an hourglass configuration.

These are just a few examples. The slats 107 can be arranged in other configurations as desired, for applying symmetrical or asymmetrical adjustments, depending on the thickness distribution observed prior to the adjustment. For example, using a second order polynomial to compute the extension length of each slat 107, a substantially elliptical aperture 108 is achieved.

FIG. 10 is a flow chart of an example of a method.

At step 1000 a chamber is provided containing therein at least one sputter target and at least one substrate to be coated. In some embodiments, the substrate is a soda lime glass panel for fabricating a solar panel.

At step 1002, a first sputtering operation on is performed on a first substrate in the chamber before performing an aperture adjustment.

At step 1004, a thickness profile of a coating deposited on the first substrate during the first sputtering operation is determined. A determination is made whether the thickness of the coating is greatest at a center of the substrate, at one end of the substrate, or at two opposite ends of the substrate.

At step 1006, an amount or type of the adjusting is determined based on the thickness profile of the first substrate. For example, as shown in FIGS. 8A and 8B, if the thickness profile of the coating deposited on the first substrate is thicker at an end of the substrate than at a center of the substrate (FIG. 8A), the adjusting is performed so that aperture 108 has at least one convex side 108cv after the adjusting (e.g., the top side of the aperture 108 in FIG. 8B). As another example, if the thickness profile of the coating deposited on the first substrate is thinner at an end of the substrate than at a center of the substrate, as shown in FIG. 9A, the adjusting is performed so that aperture 108 has at least one concave side 108cc (FIG. 9B) after the adjusting. In both of these cases, by providing an aperture 108 that is larger where the coating on the first substrate is thinner, and smaller where the coating on the first substrate is thicker results in a more uniform coating thickness for subsequently sputtered substrates.

In some embodiments, the control unit 112 determines whether the thickness of the coating is substantially uniform, thickest at the center, thickest at both ends, or monotonically increasing from one side to the other. If the thickness is uniform, a profile as shown in FIG. 6 is selected. If the thickness is thickest at the center, a profile as shown in FIG. 9B is selected. If the thickness is thinnest at the center, a profile as shown in FIG. 8B is selected. If the thickness is monotonically increasing, a profile as shown in FIG. 3 is selected.

Besides determining the shape of the aperture, the total area of the aperture can be adjusted by applying the same extension to each of the slats 107. This results in an up or down movement of the edge of the aperture, without changing the slope of the edge of the aperture.

At step 1008, the at least one adjustable shielding member is adjusted based on the determination of step 1006, to set at least one of the group consisting of an area and a shape of an aperture. The control unit 112 uses the selected profile from step 1006, and determines a position for each respective slat 107 of the adjustable shielding member 106. The control unit 112 then transmits control signals to the respective linear actuators/servomotors to cause each to move to the position for that slat 107 corresponding to the selected profile.

At step 1010, a second and/or subsequent sputtering operation is performed in the chamber after the adjusting. The first and second sputtering steps and the adjusting step are all performed under a partial vacuum. Thus, the adjusting can be performed without opening the chamber or breaking the vacuum. Although this example discusses one adjustment, the aperture area of the adjustable shielding member (shielding) can be changed multiple times, as appropriate, according to the changes of target shape throughout the target life-cycle. Further, with the adjustable shielding member in place, other trimming methods, such as tuning the magnetic field (by shimming magnets or demagnetizing panels), or adjusting the sputter trimming gas distribution are not needed.

Using these methods, improved coatings and products can be deposited. For example, the efficiency of a CIGS-based solar cell can be enhanced by smooth morphology and compositional uniformity of the CIG precursor. The thickness uniformity in large area in-line sputtering is improved. Improved thickness uniformity is advantageous for producing quantities of high quality and high efficiency thin film solar cells. When used for CIGS-based solar cells, the method and structure improve Cu/(Ga+In) ratio (within panel uniformity). The CuInGa precursors are provided with a smooth surface morphology.

In some embodiments, sputtering apparatus comprises a chamber configured to contain therein at least one sputter target and at least one substrate to be coated. The chamber has at least one adjustable shielding member defining an adjustable aperture. The member is positioned between the at least one sputter target and the at least one substrate. The aperture is adjustable in at least one of the group consisting of area and shape.

In some embodiments, sputtering apparatus comprises a chamber configured to contain therein at least one sputter target and at least one substrate to be coated. A plurality of coplanar movable plates are positioned between the at least one sputter target and the at least one substrate, the plates defining an adjustable aperture.

In some embodiments, a method comprises: providing a chamber containing therein at least one sputter target and at least one substrate to be coated; adjusting at least one adjustable shielding member to set at least one of the group consisting of an area and a shape of an aperture, the member positioned between the at least one sputter target and the at least one substrate.

The control methods and control units 112 described herein may be at least partially embodied in the form of computer-implemented processes and apparatus for practicing those processes. The disclosed methods may also be at least partially embodied in the form of tangible, non-transient machine readable storage media encoded with computer program code.

The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. Sputtering apparatus, comprising:
a chamber configured to contain therein at least one sputter target and at least one substrate to be coated;
the chamber having a frame member from which at least one adjustable shielding member extends, defining an adjustable aperture, the shielding member positioned between the sputter target and the substrate, the aperture being adjustable in at least one of the group consisting of area and shape,
wherein the at least one adjustable shielding member includes a plurality of slats, arranged in parallel along a length of the frame member along a same side of the aperture, the plurality of slats being movable independently from each other in a direction perpendicular to the length of the frame member.

2. The apparatus of claim 1, wherein the chamber has a conveyor for moving the substrate past the aperture while the substrate is being coated.

3. The apparatus of claim 1, further comprising a respective linear actuator or servomotor for each respective movable slat.

4. The apparatus of claim 3, wherein:
the chamber is configured to be operated at a partial vacuum pressure below atmospheric pressure; and
the linear actuators or servomotors are configured to be adjusted remotely while the chamber is at the partial vacuum pressure.

5. The apparatus of claim 3, further comprising a control unit configured to operate the linear actuators or servomotors.

6. The apparatus of claim 1, wherein each slat has a projection on a face thereof, the apparatus further comprising a plate having a plurality of slots, each slot configured to receive the respective projection of a respective one of the slats, for guiding movement of that slat.

7. The apparatus of claim 1, wherein the plurality of slats s are spaced sufficiently close to each other so that an edge defining the aperture is substantially continuous along ends of the plurality of slats.

8. The apparatus of claim 1, wherein the at least one adjustable shielding member includes a plurality of independently movable slats, arranged along each of at least two opposite sides of the aperture.

9. The apparatus of claim 8, wherein the aperture is substantially rectangular if the movable slats are all fully retracted.

10. The apparatus of claim 9, wherein the slats are positionable into arrangements, such that the aperture is substantially pentagonal or hexagonal.

11. The apparatus of claim 1, wherein the at least one adjustable shielding member includes at least one movable plate on a first side of the aperture, the at least one movable plate having at least one edge that is neither parallel to nor perpendicular to a second side of the aperture, the second side of the aperture adjacent the first side of the aperture.

12. Sputtering apparatus, comprising:
a chamber configured to contain therein at least one sputter target and at least one substrate to be coated, the chamber having a first frame member and a second frame member on opposite sides of the substrate from each other;
a plurality of coplanar independently movable plates extending from the first frame member and movable in a direction perpendicular to a length of the first frame member, the plates positioned between the at least one sputter target and a position of the at least one substrate, the plates extending only part way from the first frame member to the second frame member, defining an adjustable aperture between the plates and the second frame member, such that two or more of the plates are arranged in parallel along a same side of the aperture.

13. The apparatus of claim 12, wherein the chamber has a conveyor for moving the substrate past the aperture while the substrate is being coated.

14. The apparatus of claim 13, wherein:
the apparatus further comprises a respective linear actuator or servomotor for each respective movable slat, the chamber configured to be operated at a partial vacuum pressure below atmospheric pressure, and the linear actuators or servomotors configured to be adjusted remotely while the chamber is at the partial vacuum pressure.

15. A method comprising:
providing a chamber containing therein at least one sputter target and at least one substrate to be coated, the chamber having a frame member from which a plurality of shielding members extend in a direction perpendicular to a length of the frame member, defining an aperture, including at least two independently adjustable shielding members movable in parallel to each other on a same side of the aperture;
adjusting the at least two adjustable shielding members by different amounts from each other in the direction perpendicular to the length of the frame member, to set a shape of the aperture, the shielding members positioned between the at least one sputter target and the at least one substrate.

16. The method of claim 15, further comprising:
performing a sputtering operation in the chamber after the adjusting; and
conveying the substrate past the aperture during the sputtering operation.

17. The method of claim 15, further comprising
performing a first sputtering operation on a first substrate in the chamber before the adjusting;
determining a thickness profile of a coating deposited on the first substrate during the first sputtering operation;
determining an amount or type of the adjusting based on the thickness profile; and
performing a second sputtering operation on a second substrate in the chamber after the adjusting.

18. The method of claim 17, wherein the adjusting is performed so that aperture has at least one convex side wider in a center thereof than at ends thereof after the adjusting, if the thickness profile of the coating deposited on the first substrate is thicker at an end of the substrate than at a center of the substrate.

19. The method of claim 17, wherein the adjusting is performed so that aperture has at least one concave side wider at ends thereof than at a middle thereof after the adjusting, if the thickness profile of the coating deposited on the first substrate is thinner at an end of the substrate than at a center of the substrate.

20. The method of claim 17, wherein the first and second sputtering steps and the adjusting step are all performed under a partial vacuum.

* * * * *